(12) United States Patent
Wijeratne et al.

(10) Patent No.: US 7,002,855 B2
(45) Date of Patent: Feb. 21, 2006

(54) LEAKAGE TOLERANT REGISTER FILE

(75) Inventors: Sapumal Wijeratne, Portland, OR (US); Pankaj Aswal, Portland, OR (US); Mohammad M. Haq, Portland, OR (US); Marijan Persun, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 181 days.

(21) Appl. No.: 10/769,227

(22) Filed: Jan. 30, 2004

(65) Prior Publication Data

US 2005/0068827 A1   Mar. 31, 2005

Related U.S. Application Data

(63) Continuation-in-part of application No. 10/676,985, filed on Sep. 30, 2003.

(51) Int. Cl.
*G11C 7/00* (2006.01)

(52) U.S. Cl. ............. 365/189.12; 365/154; 365/189.08

(58) Field of Classification Search ........... 365/189.12, 365/154, 189.08, 230.05
See application file for complete search history.

(56) References Cited

U.S. PATENT DOCUMENTS

| | | | |
|---|---|---|---|
| 5,870,331 A * | 2/1999 | Hwang et al. | 365/154 |
| 6,104,642 A * | 8/2000 | Blomgren et al. | 365/189.02 |
| 6,204,696 B1 | 3/2001 | Krishnamurthy et al. | |
| 6,320,795 B1 * | 11/2001 | Balamurugan et al. | 365/189.08 |
| 6,510,077 B1 | 1/2003 | Alvandpour et al. | |
| 6,510,092 B1 | 1/2003 | Mathew et al. | |
| 6,549,040 B1 | 4/2003 | Alvandpour et al. | |
| 6,597,223 B1 | 7/2003 | Vangal et al. | |
| 6,597,623 B1 | 7/2003 | Krishnamurthy et al. | |
| 6,614,680 B1 | 9/2003 | Alvandpour et al. | |
| 6,618,316 B1 | 9/2003 | Hsu et al. | |
| 6,628,143 B1 | 9/2003 | Hsu et al. | |
| 6,628,557 B1 | 9/2003 | Hsu et al. | |
| 6,690,604 B1 * | 2/2004 | Hsu et al. | 365/189.05 |

* cited by examiner

*Primary Examiner*—Anh Phung
(74) *Attorney, Agent, or Firm*—Schwabe, Williamson & Wyatt, P.C.

(57) ABSTRACT

A register file includes a dynamic local bit trace, a plurality of data cells coupled to the dynamic local bit trace, and a device coupled to the dynamic local bit trace to facilitate precharging the dynamic local bit trace to a precharge value and to intelligently hold the precharged value on the dynamic local bit trace during evaluation of the dynamic local bit trace.

34 Claims, 12 Drawing Sheets

FIG. 1 – Prior Art ically to integrated circuit design, and, more particularly to register file design.

LEAKAGE TOLERANT REGISTER FILE

CROSS REFERENCE TO RELATED APPLICATIONS

This application is a Continuation-in-Part of U.S. patent applicant Ser. No. 10/676,985 filed on Sep. 30, 2003.

BACKGROUND

1. Field of the Invention

This disclosure relates to integrated circuit design, and, more particularly to register file design.

2. Description of the Related Art

In today's computer systems, there are various types of storage devices. These various levels of storage support different needs. For example, one need in some computer systems is the need for mass storage that is relatively low priced. This need is frequently met by large, inexpensive fixed-disk storage devices. The tradeoff for these large, inexpensive fixed-disk storage devices is that these devices have slow access times.

In comparison, there is, at times in certain systems, a need for memory devices that can provide very quick access for the reading and/or writing of data. A type of such memory devices is referred to as register files, which are often on the same die as a processing unit that accesses them as they are accessed very frequently. In addition to quick access times, preferably, these devices are robust, and consume low power.

FIG. 1 illustrates a read portion of a prior art dynamic register file design. In this example, eight data cells 140 are multiplexed to support a dynamic local bit line 110. A clock signal applied via trace 122 to transistor 124 is used to precharge the dynamic local bit line 110 to a known value. Keeper circuit 130 is utilized to "keep" the precharged value on the dynamic local bit line 110 during an evaluation phase of a register file access. During the evaluation phase, for a set of eight data cells 140 possibly containing a data value to be "read", one of the read enable lines 142 may be used to enable the read of a corresponding data value 141. Upon the assertion of a read enable line 142, a corresponding stored data value may be driven on the local bit line 110. If no read enable line 142 is enabled for the set of eight data cells 140, the keeper circuit 130 is utilized to retain the precharged value on the local bit line 110. The local bit lines are then utilized to drive a subsequent multiplexing circuit to form a global bit line (not shown).

Applicants have recognized a number of conflicting requirements for efficient and/or effective implementations of such dynamic designs, especially in a new generation of high operating frequency integrated circuits. For example, in order to minimize the evaluation time and thus increase the operating frequency, it is desirable to use low threshold voltage transistors for transistors 144 and 148. However, leakage of current through transistors 144 and 148 will affect the robustness of this prior art design. Since lower threshold voltage transistors are more susceptible to leakage, they can not be employed without addressing their susceptibility. Leakage is undesirable as it may cause erroneous evaluations if too much charge is lost. In contrast, using high threshold voltage transistors results in an unacceptably long read delay as the increased threshold voltages increase response times.

Keeper circuits have been used to increase the robustness of the dynamic local bit line design. Keeper circuits are utilized to maintain the precharged value on the dynamic local bit line 110 in cases where low threshold voltage transistors 144 148 may otherwise allow the improper discharge of the precharged value via leakage current. In order to maintain the precharged value on the local bit line, an upsized transistor 132 is utilized as part of the keeper circuitry 130. However, this upsized keeper also results in a read delay that may be unacceptable for the next generation's high operating frequencies.

BRIEF DESCRIPTION OF THE DRAWINGS

Embodiments of the present invention will be described referencing the accompanying drawings in which like references denote similar elements, and in which.

DETAILED DESCRIPTION OF EMBODIMENTS OF THE INVENTION

Figure 1:
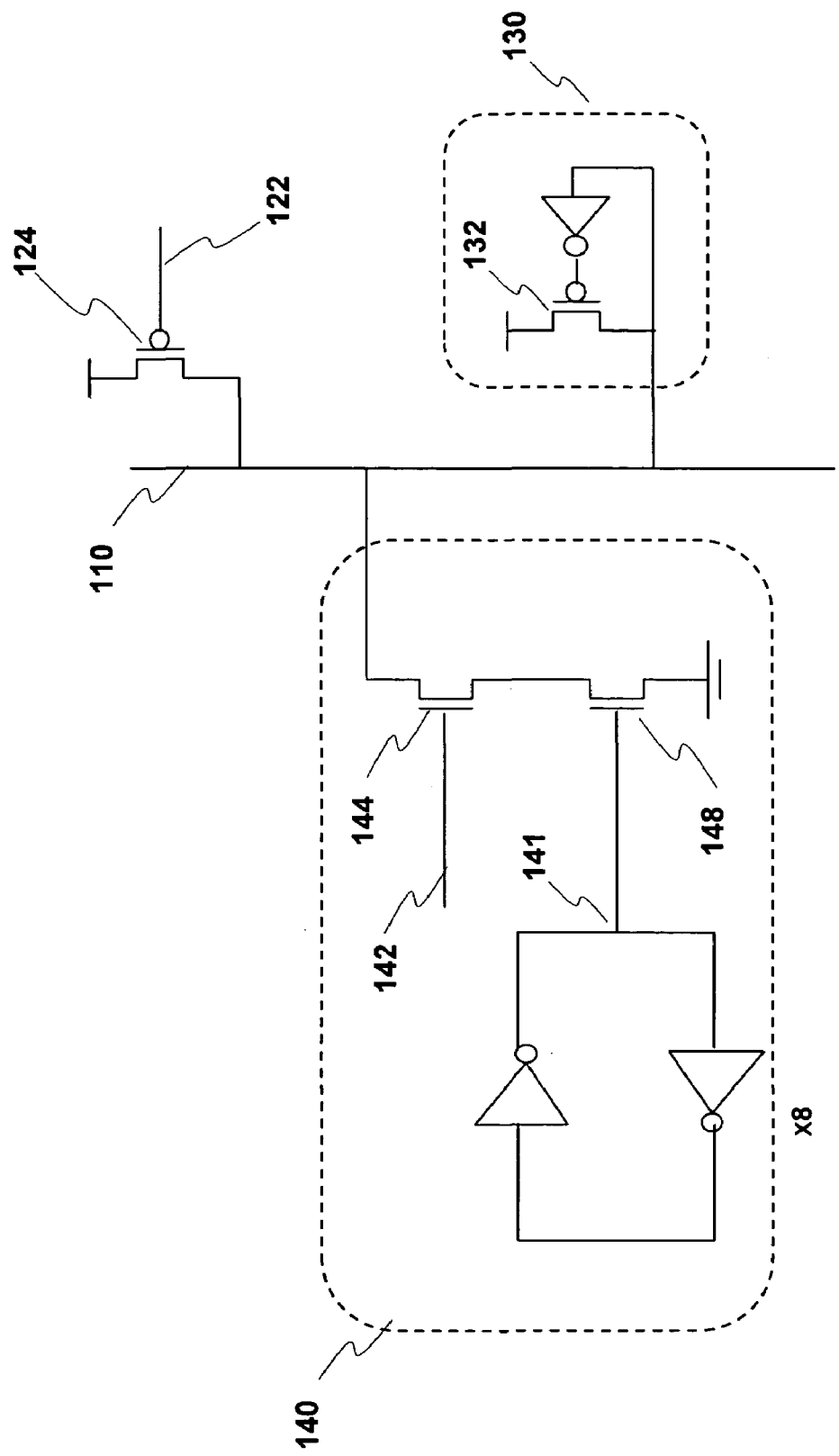
FIG. 1 (Prior Art) illustrates a read portion of a dynamic register file design.

In the following description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

The term "keeper" typically refers to a circuit added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A full-keeper is a circuit providing a switchable, direct, conductive pathway between the dynamic node and two voltage sources, e.g., a positive voltage and ground, and therefore operable to maintain the dynamic node at either a high or low level. A keeper-interrupt is a circuit providing a switchable, direct, conductive pathway between the dynamic node and a first voltage source, e.g., a positive voltage, and a switchable, indirect pathway between the dynamic node and a second voltage source, e.g., ground. In a keeper-interrupt circuit, there is at least one switchable circuit element coupled between the dynamic node and keeper-interrupt pathway to the second voltage source.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal salicides are examples of other conductors. In addition, while typically "signal" refers to the values being driven on a signal path or signal trace, colloquially, when referencing figures it is common to reference an illustrated signal trace and refer to the signal that is being drive on that signal trace.

Figure 2:
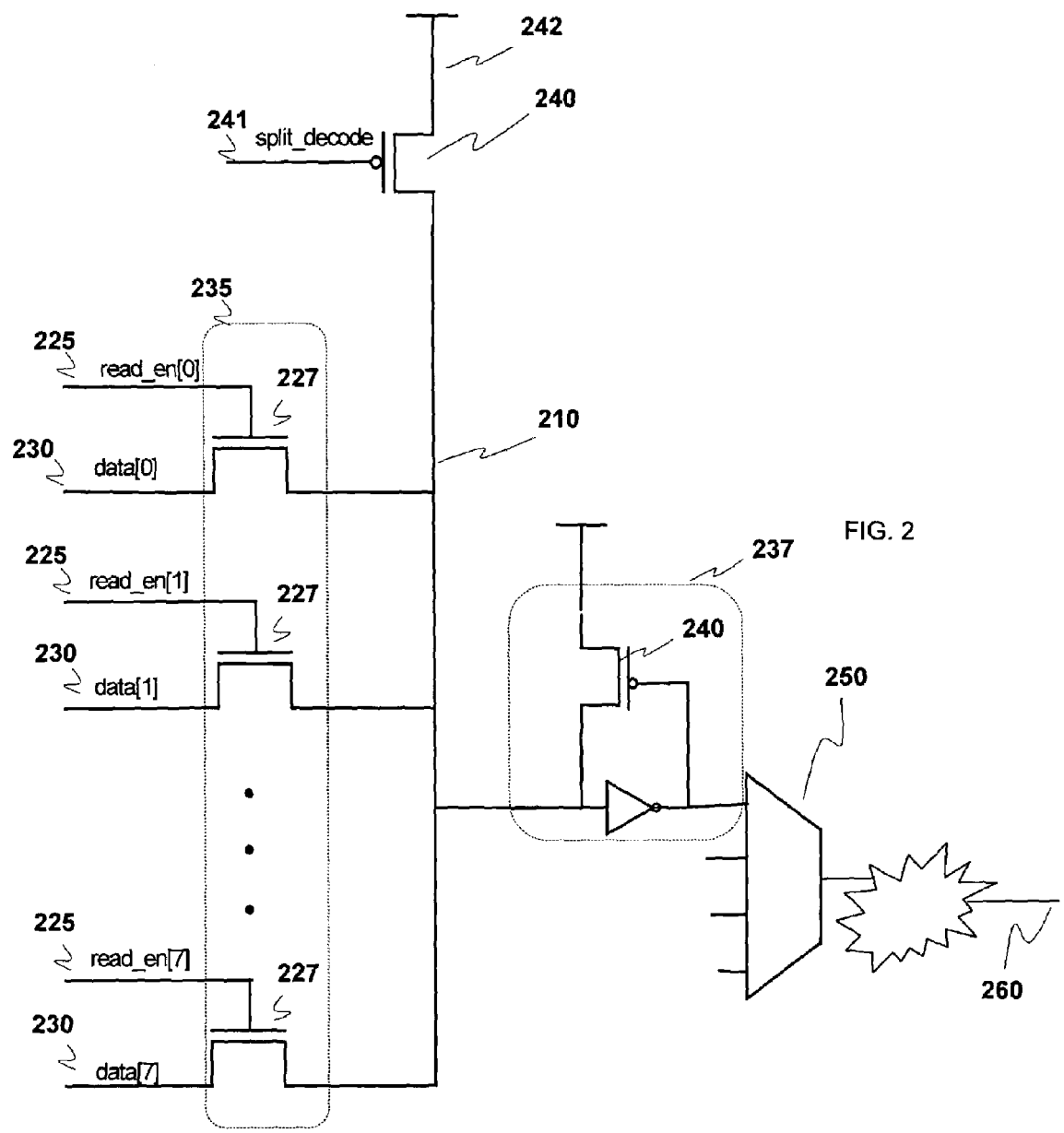
FIG. 2 illustrates a register file with a static, leakage tolerant local bit line, in accordance with one embodiment.

FIG. 2 illustrates a portion of a register file design including a static, leakage tolerant local bit trace, also known as local bit line, in accordance with one embodiment. Local bit line 210 is coupled to NMOS pass transistors 227 that provide access to data cell outputs 230. A data cell is a storage cell for maintaining a data value. In this embodiment, eight data cell outputs 230 may be coupled to a single local bit line 210. The NMOS pass transistors 227 together form a data cell multiplexer 235.

Read enable signal traces 225 are coupled to the gate of NMOS pass transistors 227. In the embodiment shown, the read enable signals driving the read enable signal traces 225 are one-hot, that is, only one read enable signal at a time is asserted. Having one read enable signal asserted results in a single data signal trace driving the local bit line 210.

A PMOS pullup transistor 240 is coupled to the local bit line 210 as well. The PMOS pullup transistor 240 may be driven by split decoder logic, to be described more fully below. Keeper circuitry 237 is utilized to maintain values on the local bit line 210. The local bit line value may be fed to multiplexer circuit 250 to be multiplexed with four other local bit lines to eventually be used in the formation of a global bit line 260.

In comparison to conventional dynamic local bit lines, where local bit lines are charged to a voltage level during each precharge period and then allowed to float during an evaluation period, local bit line 210 is intelligently charged and floated. As discussed in greater detail below, split decode signal 241 is generated such that when a read enable signal 225 is to be generated for one of the data cells signal traces 230 driving the data cell multiplexer 235, the driving transistor 240 decouples the local bit line 210 from the driving signal trace 242. Thus, the "precharging" of the local bit line 210 is performed in an intelligent manner.

In the case of dynamic logic, in every clock cycle there is an evaluation phase where leakage current may discharge through low threshold voltage transistors. However, in the present design as described below, it is known when a value will be driven by one of data cell output signal traces 230 onto the local bit line 210. Thus, it is not required that high threshold voltage transistors be used in the data cell multiplexer 235 to ensure that current leakage through the transistors does not affect the logic value on the local bit line 210. This is because one of the NMOS pass transistors 227 will drive the local bit line whenever the driving signal trace 242 is decoupled from the local bit line 210. Therefore, even if low threshold voltage transistors are utilized in the design of the data cell multiplexer 235 there is little concern about current leakage through these devices since the data is almost always actively driven for a selected local bit line. Using low threshold voltage transistors for the NMOS pass transistors 227 is expected to reduce the amount of time required to activate the NMOS pass transistors 227.

Similarly, keeper circuitry 237 will only need to momentarily hold the value on the local bit line 210. The keeper circuitry 237 will need to "keep" the value on the local bit line 210 from the time the split decoder signal 241 decouples the driving signal trace 242 from the local bit line 210 only until the appropriate read enable signal 225 facilitates the coupling of the appropriate data cell output signal trace 230, onto the local bit line 210. Thus, the keeper transistor 240 may be a relatively small one, thus reducing the amount of time local bit line 210 takes to respond to the coupling to a data cell output signal trace 230.

Figure 3A:
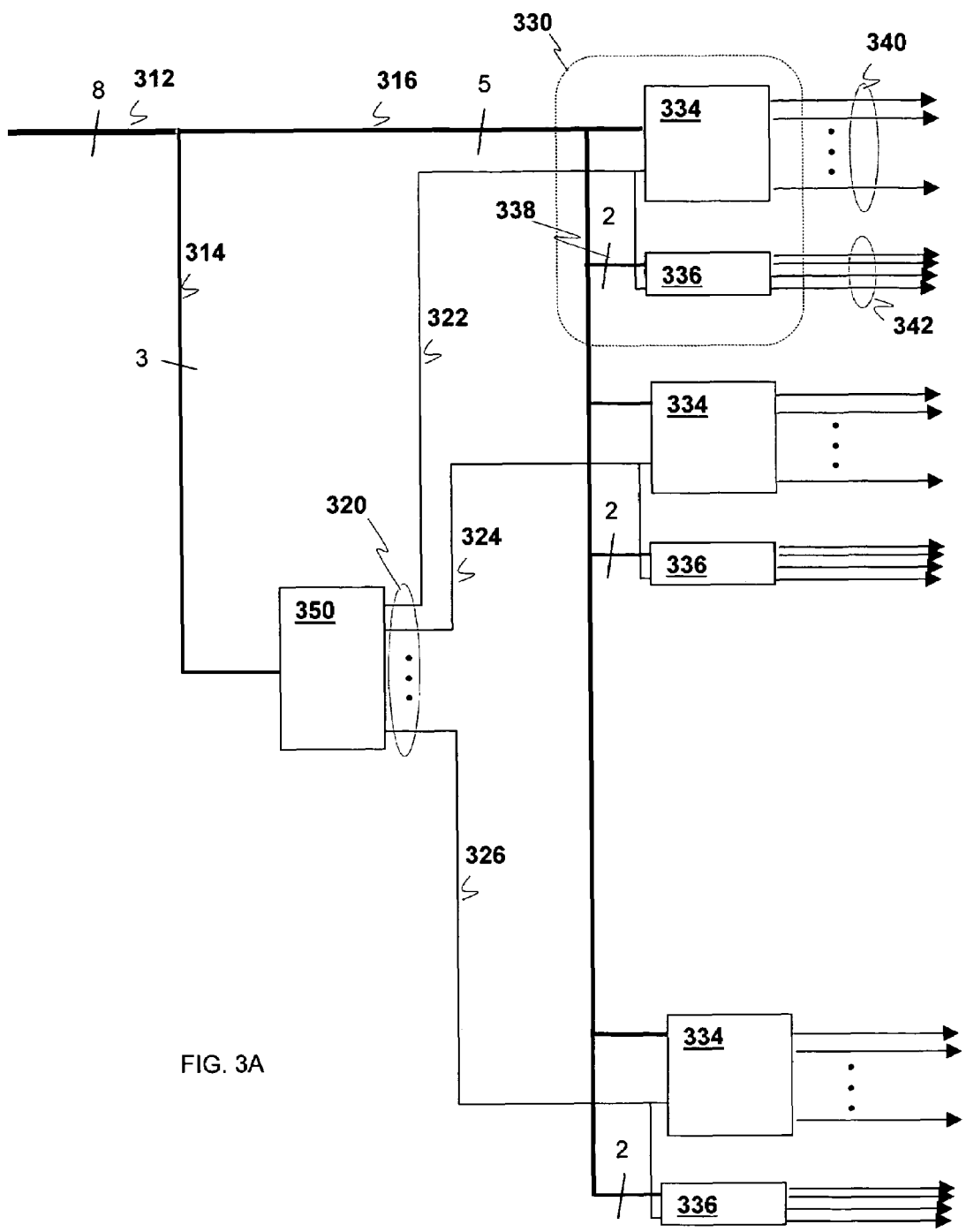
FIG. 3A illustrates a split level decoder in accordance with one embodiment.

FIG. 3A illustrates a split level decoder in accordance with one embodiment. Signals on eight address line traces (bits) 312 are utilized to identify a particular bit of 256 bits to be decoded. A multiple-level decoding operation is performed to allow for separate generation of read enable signals and the split decoder signals discussed above. In the embodiment shown, in the first level of the decode logic, the three upper most significant address line traces 314 of the eight address lines traces 312 are utilized to generate selectors 320 for the split decode logic. In the embodiment illustrated, a three to eight decoder 350 may be utilized as the first level of decode logic to generate the selectors 320.

Eight banks of second level decode logic 330 are provided to generate signals for selecting the proper bit of the device, e.g. the read enable and split decoder signals. Selectors 320 provide a one-hot identification of the corresponding second level decode logic bank 330. Each second level decode logic bank 330 contains a read enable logic block 334 and a split decoder logic block 336.

Read enable logic blocks 334 generate read enable signals on lines 340. The read enable signals are for use in enabling logic that drives an appropriate bit onto the local bit line. For example, as discussed in the embodiment associated with FIG. 2, an NMOS pass transistor 227 may be utilized to drive values of data cell output traces 230 onto a local bit line 210. Each read enable logic block 334 contains decode logic to properly decode the lower five address bits to facilitate the production of 32 read enable signals on lines 340. Such address decode logic is known in the art and will not be described further. Also utilized in the production of the 32 read enable signals for lines 340 is the selector 322 from the set of selectors 320. This selector 322 is utilized to ensure that the read enable signals 340 are only asserted when the address provided via address bits 312 actually corresponds to a data cell associated with the appropriate second level decode block 330.

The split decoder logic block 336 generates split decoder signals on lines 342. The split decoder signals are for use in driving split decoder logic as discussed herein. In the embodiment shown, the split decoder logic block 336 utilizes two address lines 338 in the generation of the split decoder signals. As with the read enable signals 340, selector 322 is utilized to ensure that the appropriate split decoder signals 342 are only asserted when the address provided 312 actually corresponds to a data cell associated with the appropriate second level decode block 330.

Referring again to the embodiment of FIG. 2, it is desirable to have the PMOS pull-up transistor 240 cease driving the local bit line 210 prior to the driving of the local bit line by the NMOS pass transistors 227. This reduces the contention on the local bit line 210 allowing for, among other things, faster read times. By having the split decoder signal on line 241 arrive before the read enable signal on line 225, the local bit line 210 floats before the NMOS pass transistor 227 drives the data value on the local bit line 210, thus reducing the contention on the local bit line.

Since the split decoder signals 342 are generated utilizing the selector and two address lines 338, the split decoder signals are available earlier than the read enable signals 340. This is because the read enables signals 340 are generated from five address bits, in comparison to the two address bits used by the split decoder, thus the read enable signals may require a longer period to decode. The additional decode time associated with the five bit decode delays the read enable signal 340 generation relative to the split decoder signal 342 generation. This may reduce contention on the local bit line.

In addition, in the embodiment illustrated in FIG. 2, there is an additional factor influencing reducing the contention on the local bit line 210. The split decoder signal drives a PMOS pull-up transistor 240 whereas the read enable signal drives an NMOS pass transistor 227. The PMOS device is a smaller load to the driving split decoder signal when compared the NMOS device load seen by the read enable signals. This results in a quicker response time that may further contribute to ensuring that the supply voltage 242 is decoupled from the local bit line 210 prior to the local bit line 210 being driven by a data cell by data cell output traces 230.

Figure 3B:
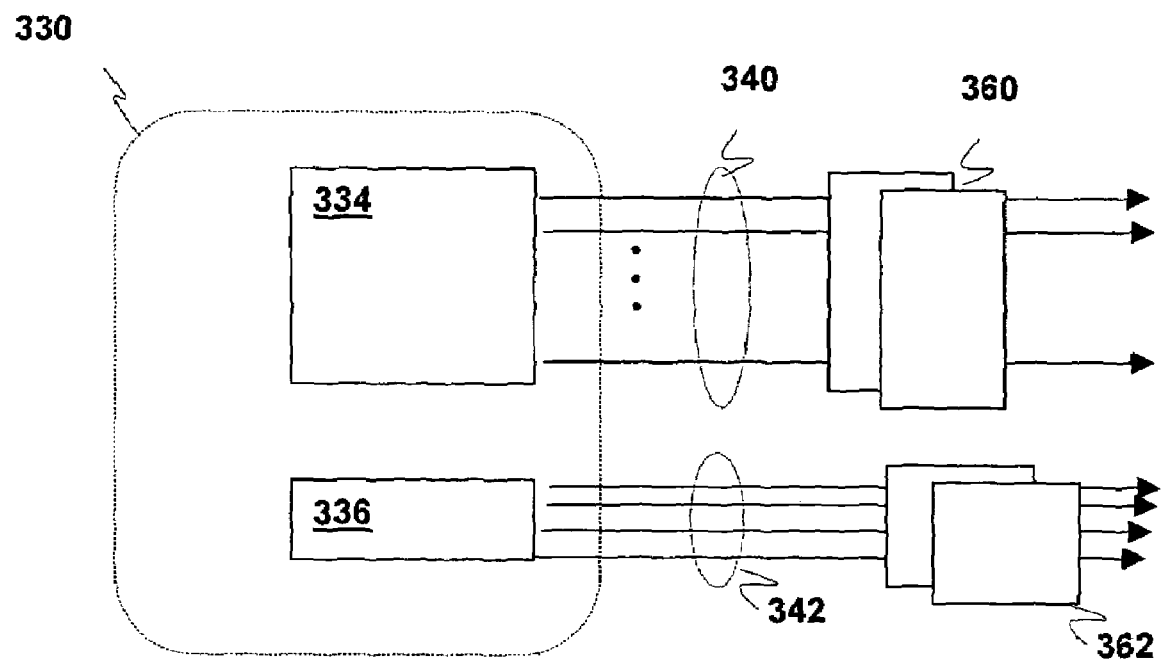
FIG. 3B illustrates an alternative split level decoder output architecture in accordance with another embodiment.

FIG. 3B illustrates an alternative output stage for the read enable signals 340 and the split decoders signals 342, in accordance with another embodiment. Illustrated is a second level decode logic bank 330 including a read enable logic block 334 and a split decoder logic block 336. However, the outputs 340 342 of both the read enable logic block 334 and the split decoder logic block 336 are registered via flip flops 360 362, respectively. While this architecture may not pass through the advantages of the earlier decode time for the split decoder signals as discussed above, the reduced load of the PMOS device driving the bit line may provide sufficient response time to avoid contention on the local bit line.

Figure 4:
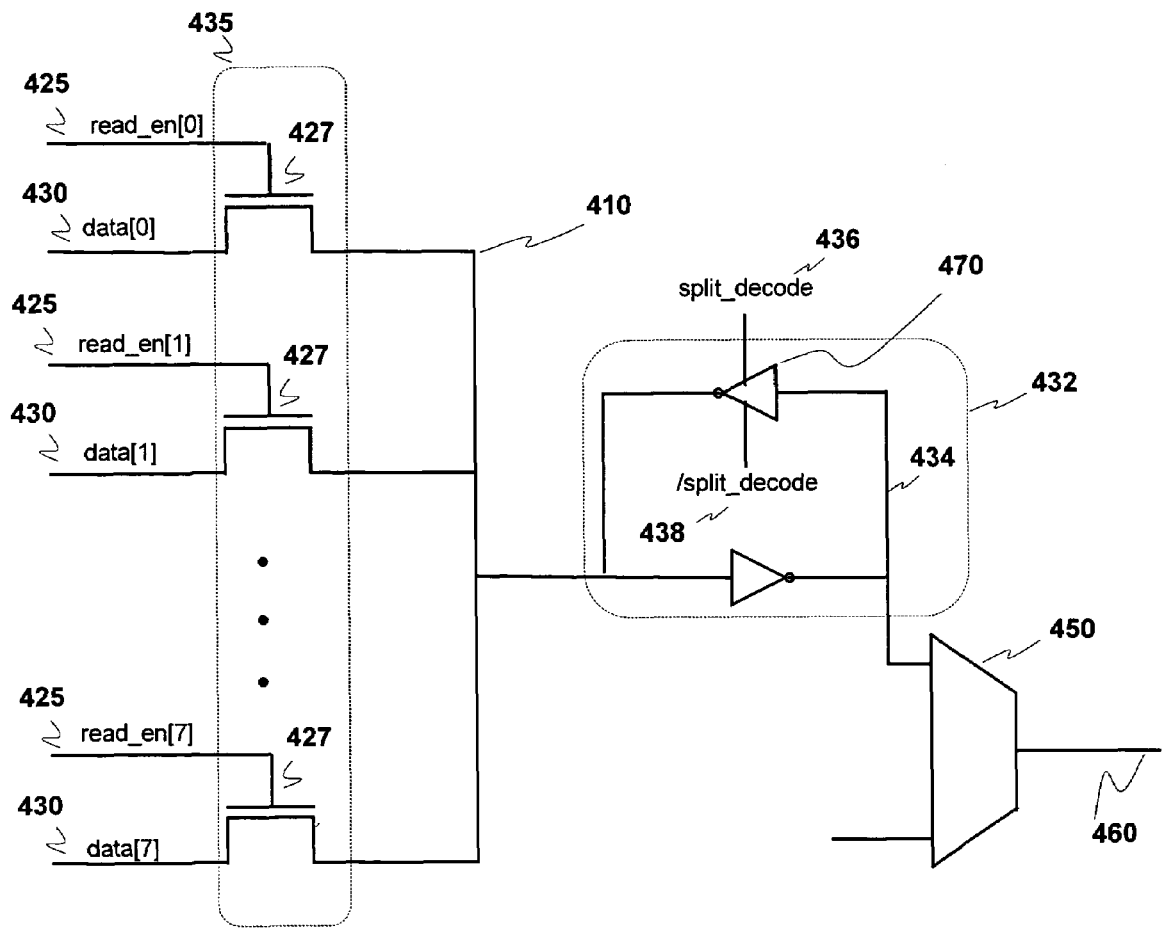
FIG. 4 illustrates a leakage tolerant local bit line design in accordance with another embodiment.

FIG. 4 illustrates a leakage tolerant local bit line design in accordance with another embodiment. In this embodiment, a data cell multiplexer 435 containing transistors 427, driven by data outputs on data cell output traces 430 and read enables 425, drives a local bit line 410 similar to the embodiment of FIG. 2. However, this architecture utilizes a fully interruptible cross-coupled inverter stage 432. When any of the read enable signals 425 are active, the split decoder 436 and split decoder inversion 438 signals are asserted. This assertion causes an interrupt in the feedback of the cross-coupled inverter stage 432. This interruption allows the local bit line 410 to float. In this manner, when a data cell value on a data cell output trace 430 is enabled by a corresponding read enable signal 425, there will not be contention for the local bit line 410. This will allow low threshold pass transistors to be used in the construction of the data cell thus contributing to decreasing read response time and increasing the operating frequency.

Figure 5:
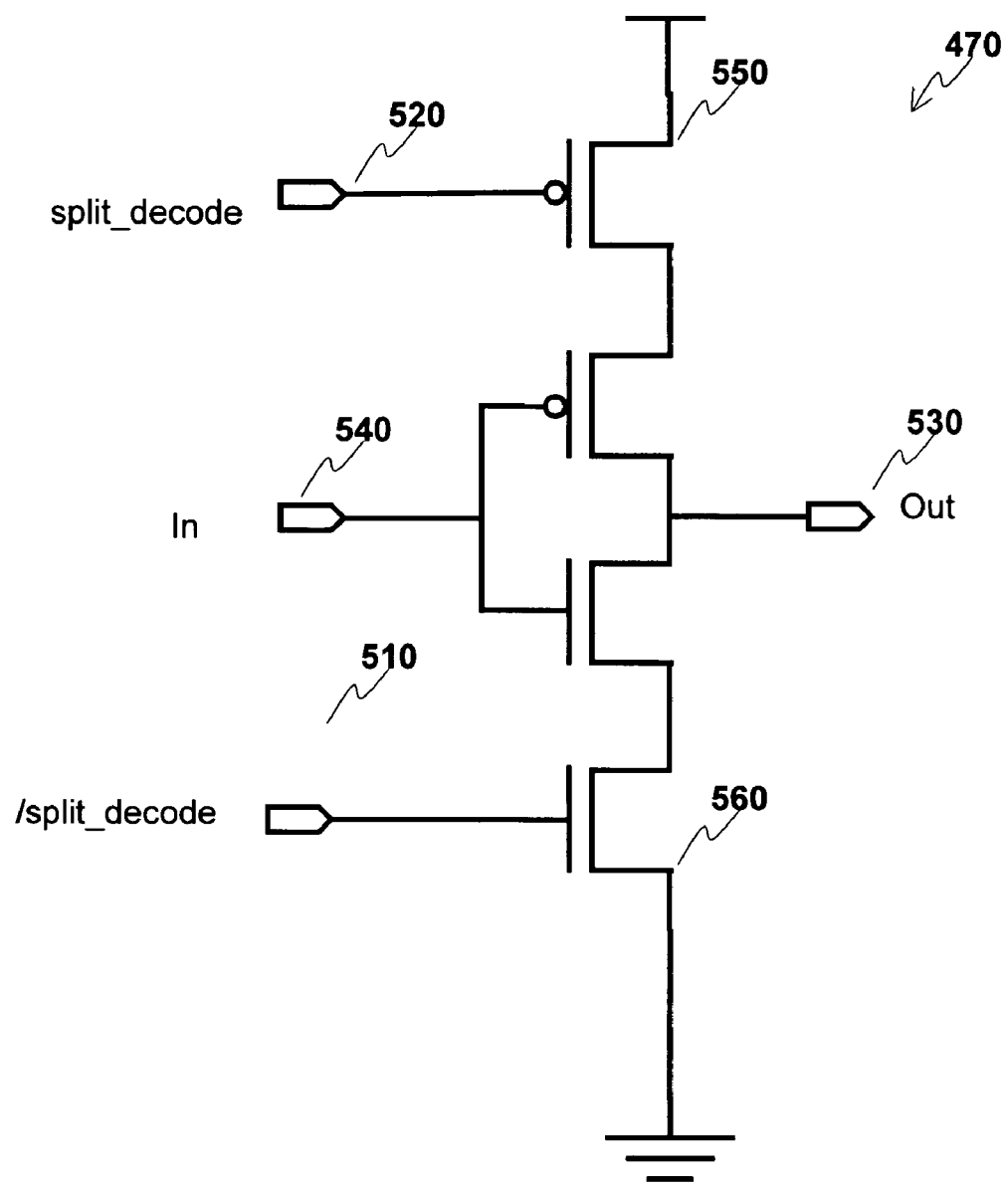
FIG. 5 illustrates the interruptible inverter of FIG. 4 in further detail, in accordance with one embodiment.

FIG. 5 illustrates an interruptible inverter 470 for use in the circuit of FIG. 4, in accordance with one embodiment. In this embodiment, signals generated by the split decoding logic, indicating that a driving signal is to be removed from a local bit line, are utilized in the control of the interruptible inverter 430. In this embodiment, the driving signal is the value currently on an intermediate node 434 of cross-coupled inverter stage 432. Split decoder signal 520 and split decoder's inversion signal 510 may be used to decouple the output of the inverter 530 from the input to the inverter 540, thus providing an interruptible inverter. In the embodiment illustrated, when the split decoder signal is asserted, the split_decode signal 520 will be high disabling PMOS device 550. Similarly, the /split_decode signal 510 is low when the split decoder signaling is asserted and NMOS device 560 is also disabled. This leaves output signal 530 undriven thus removing driving signal 434 from local bit line 410.

Figure 6:
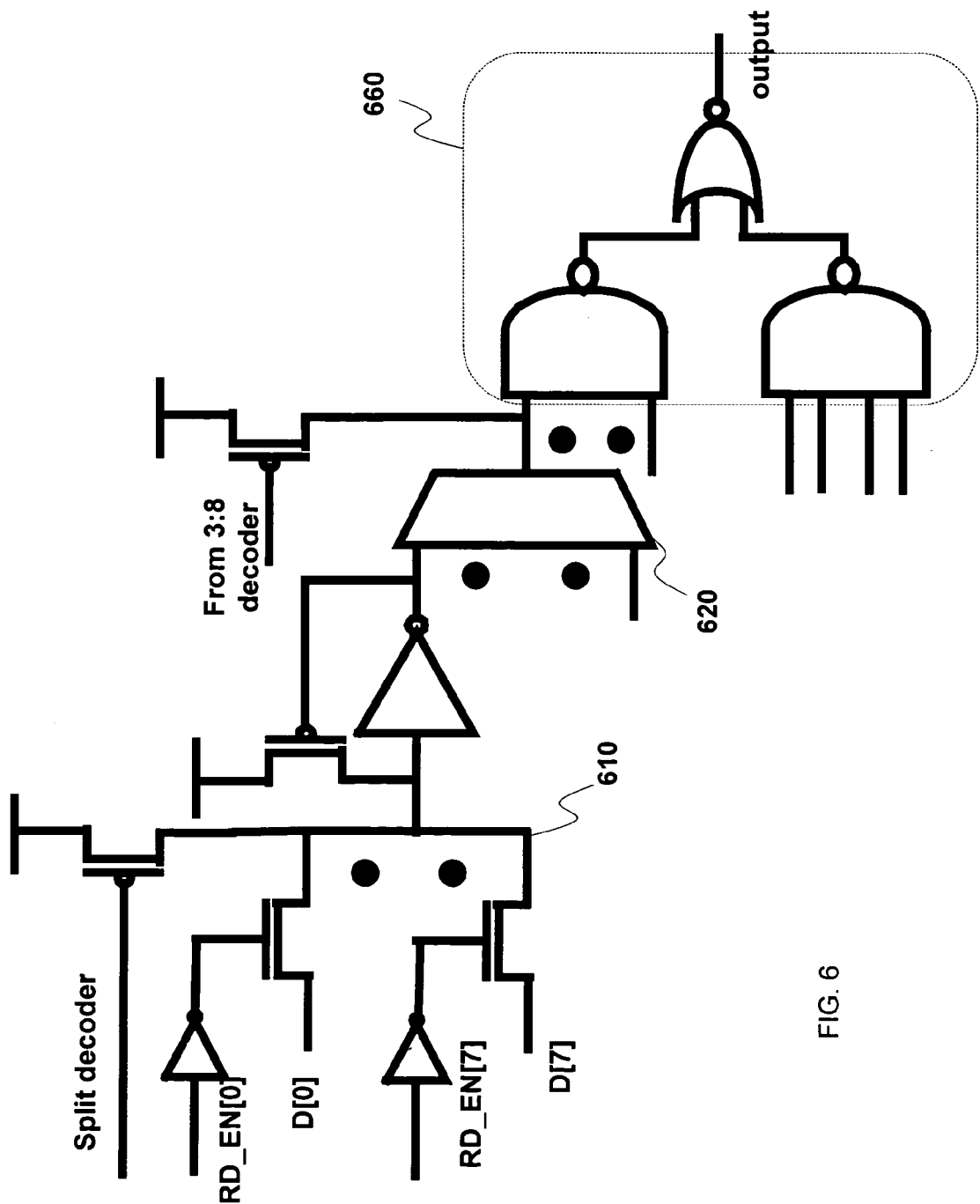
FIG. 6 illustrates one path through a 256-bit register file, in accordance with one embodiment.

FIG. 6 illustrates one path through a 256 bit register file, in accordance with one embodiment. Static local bit line 610 is coupled to the output of eight data cells, in a manner discussed with respect to the embodiment illustrated in FIG. 2. Output from static local bit line 610 is multiplexed together with outputs from three other static local bit lines in an intermediate multiplexing stage via multiplexing logic 620. Outputs of these intermediate stages are then further multiplexed together in an output multiplexing stage 660.

Figure 7:
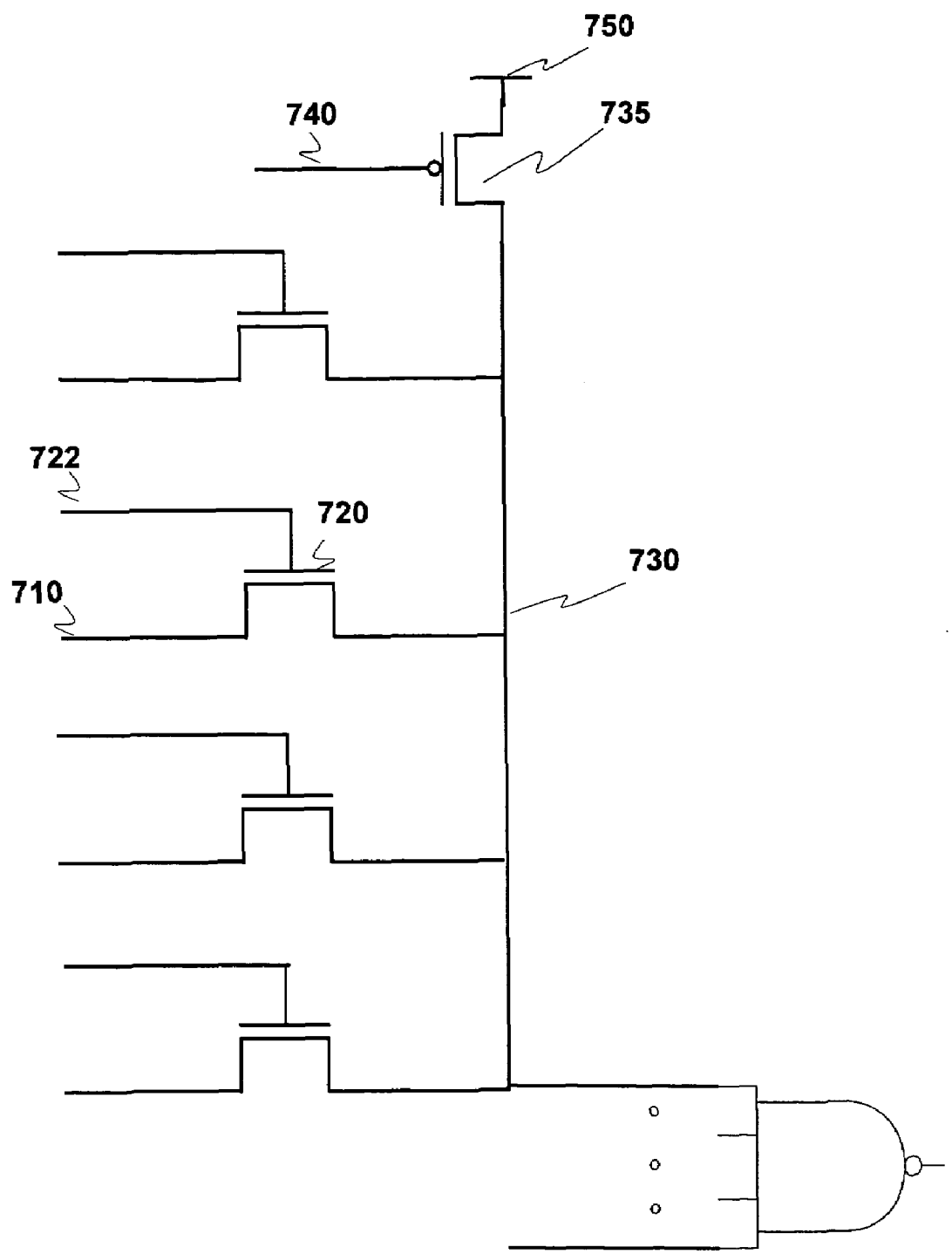
FIG. 7 illustrates a four-bit, intermediate multiplexing stage, in accordance with one embodiment.

FIG. 7 illustrates a four-bit, intermediate multiplexing stage, in accordance with one embodiment. Static local bit line outputs 710 drive multiplexed NMOS transistors 720. Gates 722 of these multiplexed NMOS transistors 720 are controlled by the corresponding split decoder signal that facilitated decoupling the driving signal from the local bit line. Thus, when a local bit line contains valid data that is being read from a specified location, corresponding transistor 720 will pass the value to intermediate bit line 730. In the embodiment illustrated, the intermediate bit line 730 is driven high by PMOS device 735 when the intermediate multiplexing stage contains no actively driven local bits. When one of the four multiplexor inputs contains valid data to be provided to an output, control signal 740 is asserted, thus removing supply voltage 750 from intermediate bit line 730.

An example of control logic that may be utilized to enable PMOS device 735 is the control logic utilized to generate selector signals 320, in accordance with the embodiment illustrated in FIG. 3. The 3 to 8 decoder 350 outputs provide an indication to the appropriate one of the eight second level decode banks to generate a read enable signal. In the embodiment illustrated, each intermediate bit line 730 is driven by a subset of the total bits that corresponds to the bits driven by the second level decode banks. Thus, the 3–8 decoder outputs will provide an indication of which of the intermediate bit lines will contain a validly selected bit.

Figure 8:
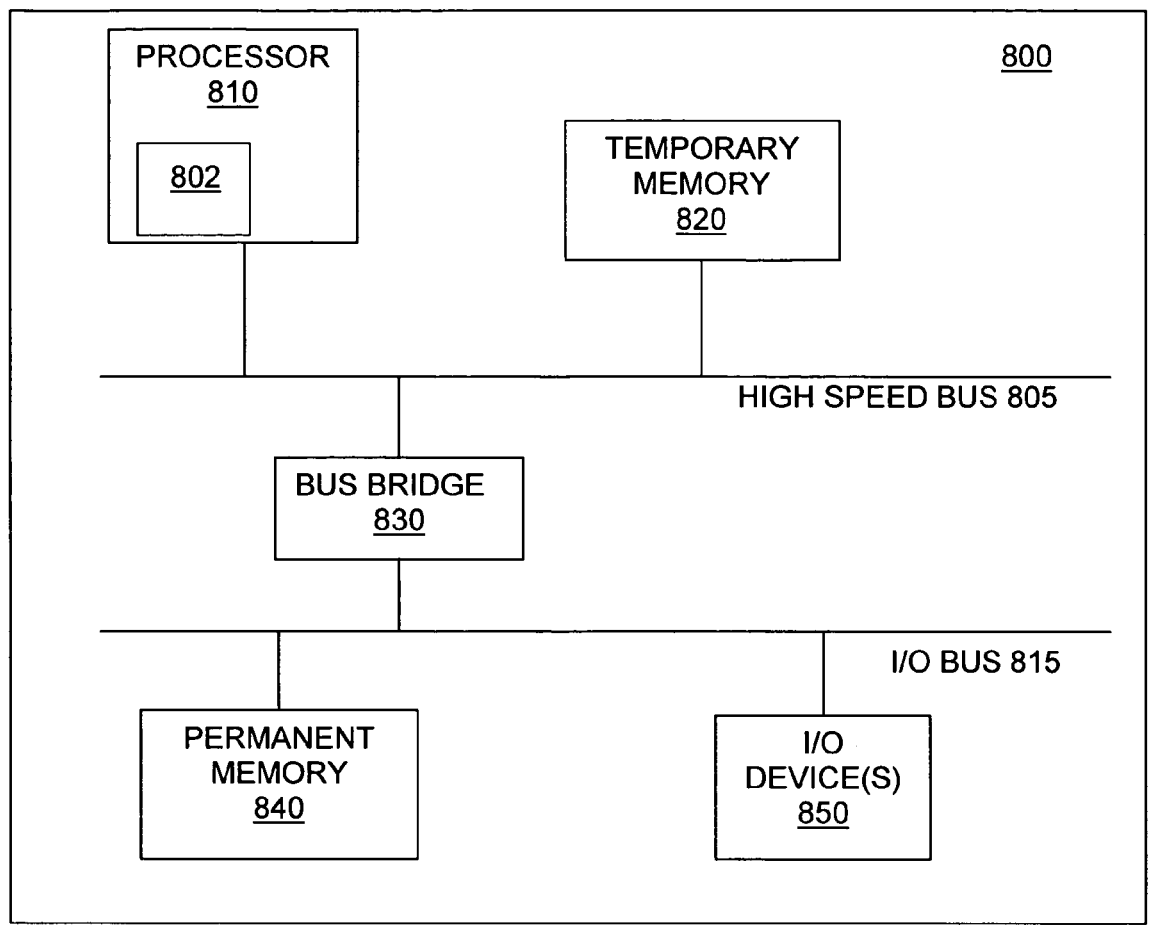
FIG. 8 illustrates is a block diagram of a computer system including a high operating frequency, yet robust, register file.

FIG. 8 illustrates is a block diagram of a computer system 800 including a high operating frequency yet robust register file 802. As shown, the computer system 800 includes a processor 810 and temporary memory 820, such as SDRAM and DRAM, on high-speed bus 805. Register file 802, incorporated with the earlier described leakage tolerant and/or split decoder teachings, advantageously provides high speed, yet robust, access to memory for processor 810.

High-speed bus is connected through bus bridge 830 to input/output (I/O) bus 815. I/O bus 815 connects permanent memory 840, such as flash devices and fixed disk device, and I/O devices 850 to each other and bus bridge 830.

Figure 9:
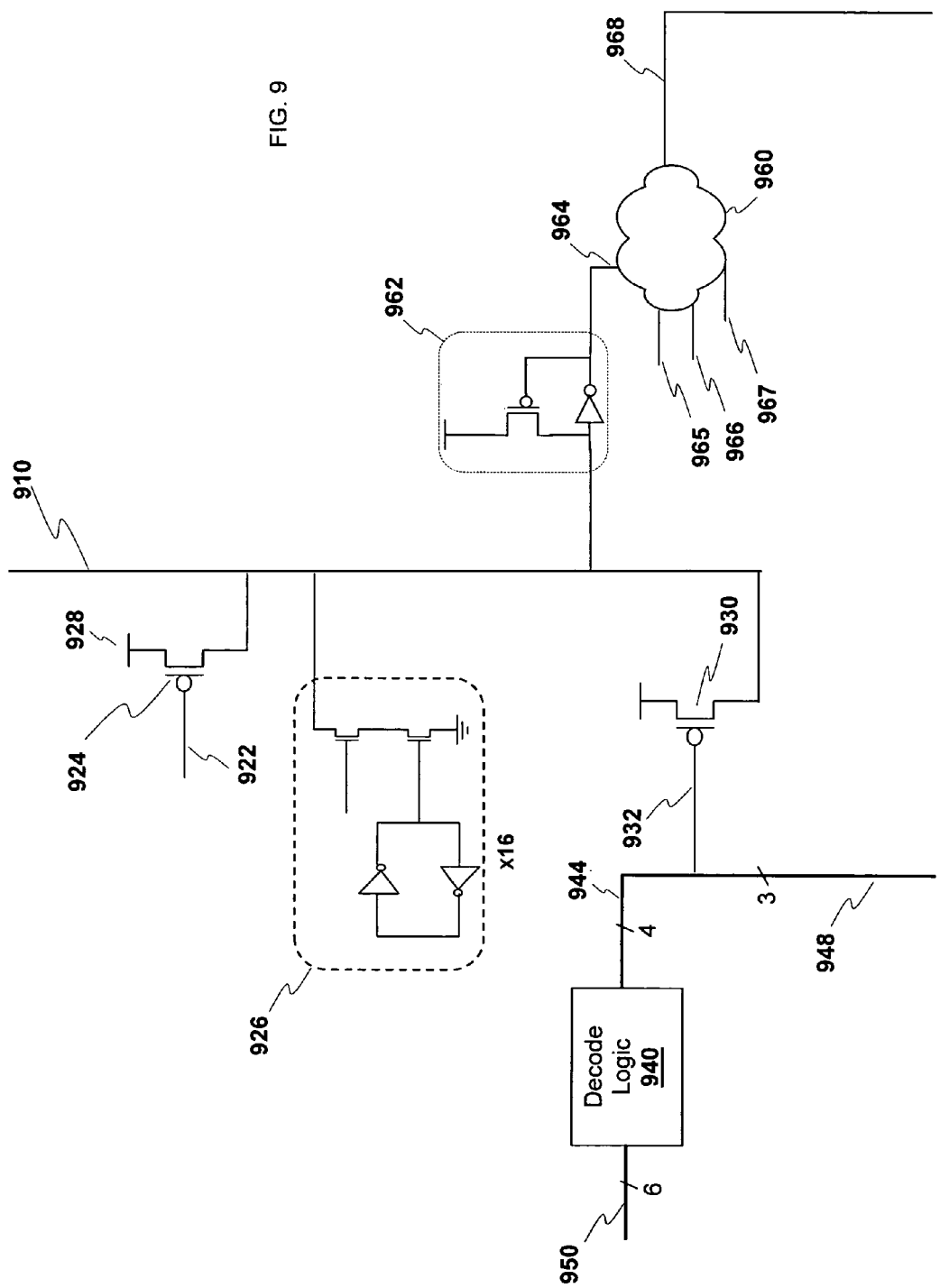
FIG. 9 illustrates a dynamic local bit line 910 including local bit line hold logic 930 in accordance with one embodiment.

FIG. 9 illustrates a leakage tolerant, dynamic local bit line 910 in accordance with one embodiment. For the embodiment, a 64-element global bit line 968 may be segmented into four local bit lines 964–967, with each local bit line comprising 16 local data elements. As previously discussed, decode logic 940 can be utilized to decode one or more of a plurality of address lines 950 to provide selection information, via selection signals 944, to segments associated with corresponding ones of local bit lines 964–967. In one embodiment, decode logic comprises a plurality of levels of logic. The selection information provided to each segment may include an indication of whether a local bit line 910 is associated with a data cell that will be driving 64-element global bit line 968. For example, in the embodiment illustrated, assume one data cell of the 64-element global bit line 968 is to be asserted, based on the address provided to the decode logic 940. Assume further that the segment included the data cell to be addressed is the segment driving local bit line 910. In this case, the decode logic output driving the segment will be asserted. The remaining segment's decode logic outputs 948, providing an indication of whether these segments contain data cells that will be enabled, will not be asserted.

Dynamic local bit line 910 is coupled to precharge circuitry 924. Precharge circuitry 924 is further coupled to a clock signal trace 922. A clock signal propagated on clock signal trace 922 performs a precharge of the dynamic local bit line 910 during a precharge portion of the clock signal. In the embodiment illustrated, the local bit line 910 is driven to high voltage level during the precharge period, in which the clock signal is at a low voltage level. When the clock signal rises, the voltage (power) supply 928 providing the precharge voltage is decoupled from the dynamic local bit line 910 allowing the local bit line 910 to "evaluate"; that is, to potentially allow one of the data cells 926 to drive the local bit line 910. In the embodiment illustrated, one of the data cells would "pull-down", or drive the local bit line 910 to a low voltage, the local bit line 910.

Previously, in the case where no data values are "driven" onto the dynamic local bit line 910, week domino keeper 962 may be utilized to "keep" the precharged voltage at a sufficiently high voltage level. This sufficient voltage level is a level that ensures that a read of the "kept" voltage level by logic 960 downstream results in a proper logic level being interpreted on local bit line 910. As previously noted, due to various limitations in today's processes, the voltage value kept on the dynamic local bit line 910 may be insufficient to properly be associated with the dynamic local bit line's proper logic value. This may occur, for example, when excessive current is leaked through low threshold voltage transistors in the read portion of a data cell. This may happen notwithstanding the presence of the domino keeper 962. This is due to a result of the domino keeper 962 having a relatively weak "keeping" ability as the domino keeper is kept small to ensure fast response time to improve circuit performance. If the keeper is too large, the read time associated with the local bit line may become too long.

Leakage current associated with transistors is continuing to increase with successive semiconductor process generation. To combat the subthreshold leakage current through the transistors of data cells 926, local bit line keeper 962 may be upsized to counter the leakage of current through the data cells 926. Eventually, as local bit line keeper's 962 size increases, the local bit line 910 may not be able to be "pulled down" by a data cell driving the local bit line 910. This may be because the local bit line keeper 962 has become so strong that the driving data cell may not be able to drive the local bit line 910 low. By providing the ability to intelligently hold the local bit line 910, it may not be necessary to increase the drive of the bit line keeper 962 as the device intelligently holding the local bit line 910 insures that sufficient current is provided to avoid current leakage problems.

In the embodiment of FIG. 9, decode logic 940 is utilized to generate a decoder signal 932 utilized to aide in the function of the local bit line 910. Decoder signal 932 is utilized to drive an additional PMOS device 930 that is coupled to the dynamic local bit line 910. PMOS device 930 is utilized during the evaluation of the dynamic local bit line 910 to intelligently hold the dynamic local bit line 910 if none of the 16 data cells 926 are to drive their respective data onto the dynamic local bit line 910. Conversely, when there is data to be accessed and driven on the local bit line 910 by one of the data cells 926, during evaluation the week keeper 962 is the only circuitry utilized to maintain the precharge value on the dynamic local bit line 910. This may allow for a quick response time to the appropriate data cell driving the local bit line 910.

When none of the data cells 926 contain data to be driven on the dynamic local bit line 910 during evaluation, strong PMOS device 930 may be utilized to conditionally insure that the dynamic local bit line 910 maintains its precharged value. This may be performed by coupling the dynamic local bit trace 910 to a driving signal trace coupled to a voltage supply 928. In this manner, dynamic local bit line 910 does not rely on week keeper 962 as the sole mechanism for maintaining the precharged value on the dynamic local bit line 910. Consequently, any operation of the circuit resulting in charge leakage from the dynamic local bit line 910 may not result in an incorrect reading of the logic level on dynamic local bit line 910. This is due to the strong PMOS device's 930 ability to provide sufficient current to ensure that the proper voltage is maintained on PMOS device 930. While the embodiment illustrated is of a "precharged high" local bit line, and thus the device utilized to hold the voltage on the local bit line is a PMOS type, it will be appreciated by those skilled in the art that local bit lines, when used in connection with pull up networks, may be "precharged low". For example, in one embodiment, a register file utilizes a NMOS type device to hold the voltage on the local bit line.

Figure 10:
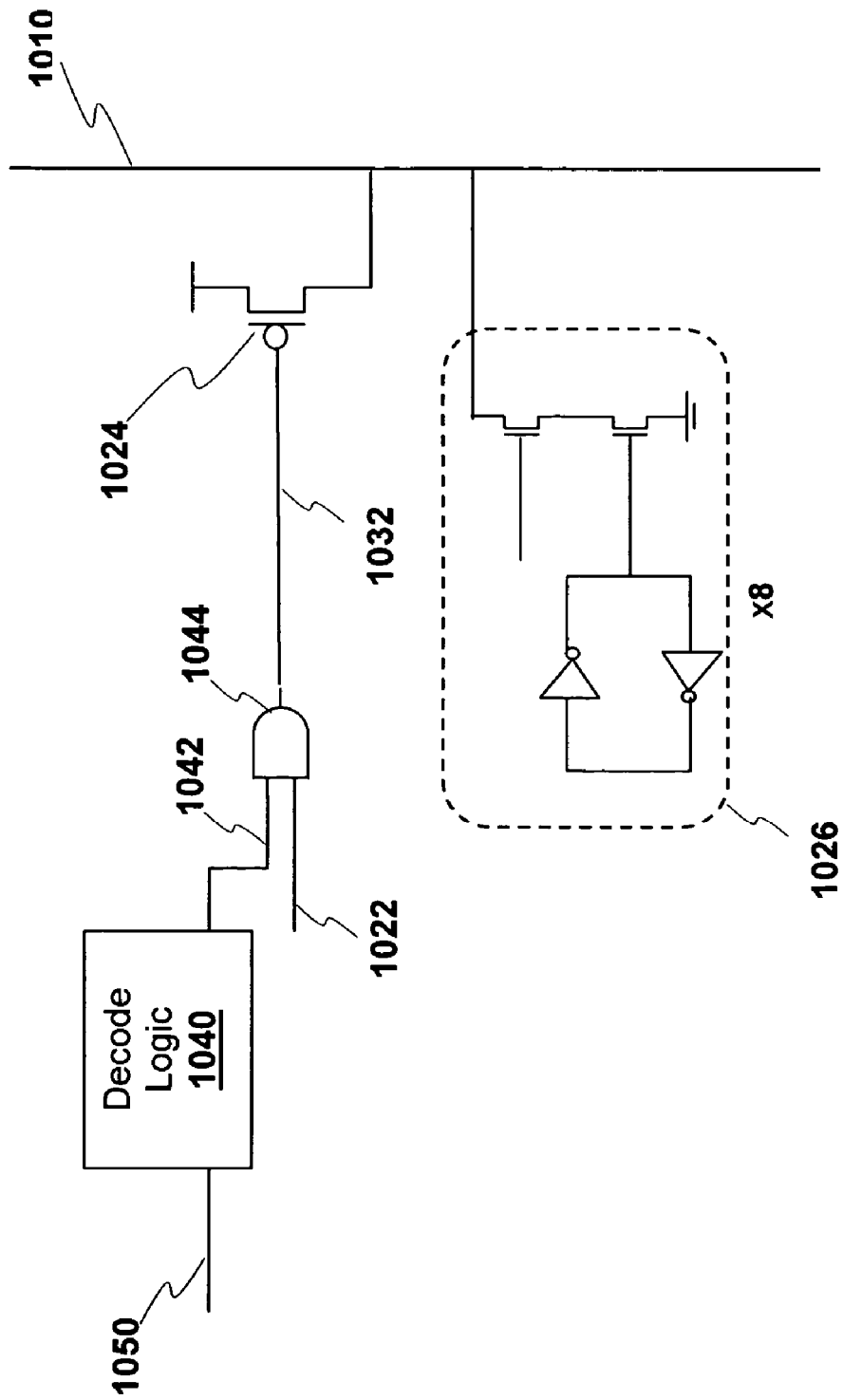
FIG. 10 illustrates a dynamic local bit line including local bit line hold logic, in accordance with another embodiment.

FIG. 10 illustrates a leakage tolerant, dynamic local bit line 1010 in accordance with another embodiment. A device utilized to perform the precharge function may operate also to be utilized during evaluation to conditionally insure that the precharged value is kept on the dynamic local bit line. Illustrated in FIG. 10 is a dual-purpose device 1024 to perform both precharge and conditional evaluation functionality. Thus, this dual-purpose device 1024 precharges the local bit line 1010 during a precharge phase of a clock cycle. In addition, the dual-purpose device 1024 also conditionally "holds" the precharged value on the dynamic local bit line 1010 during the evaluate phase of the clock cycle.

In the embodiment illustrated, address signals 1050 are decoded by decode logic 1040. A resulting select signal 1042 from the decode logic 1040 provides an indication to a segment that one of the segment's data cells 1026 will drive a local bit line 1010. The select signal 1042 can be combined with a clock signal 1022 via device control logic 1044 to produce a composite signal 1032 that allows dual-purpose device 1024 to provide precharge functionality to the dynamic local bit line 1010 during an inactive clock phase (precharge). The composite signal 1032 also allows dual-purpose device 1024, when appropriate during an evaluation phase, to insure that the dynamic local bit line 1010 maintains a precharged value.

Figure 11:
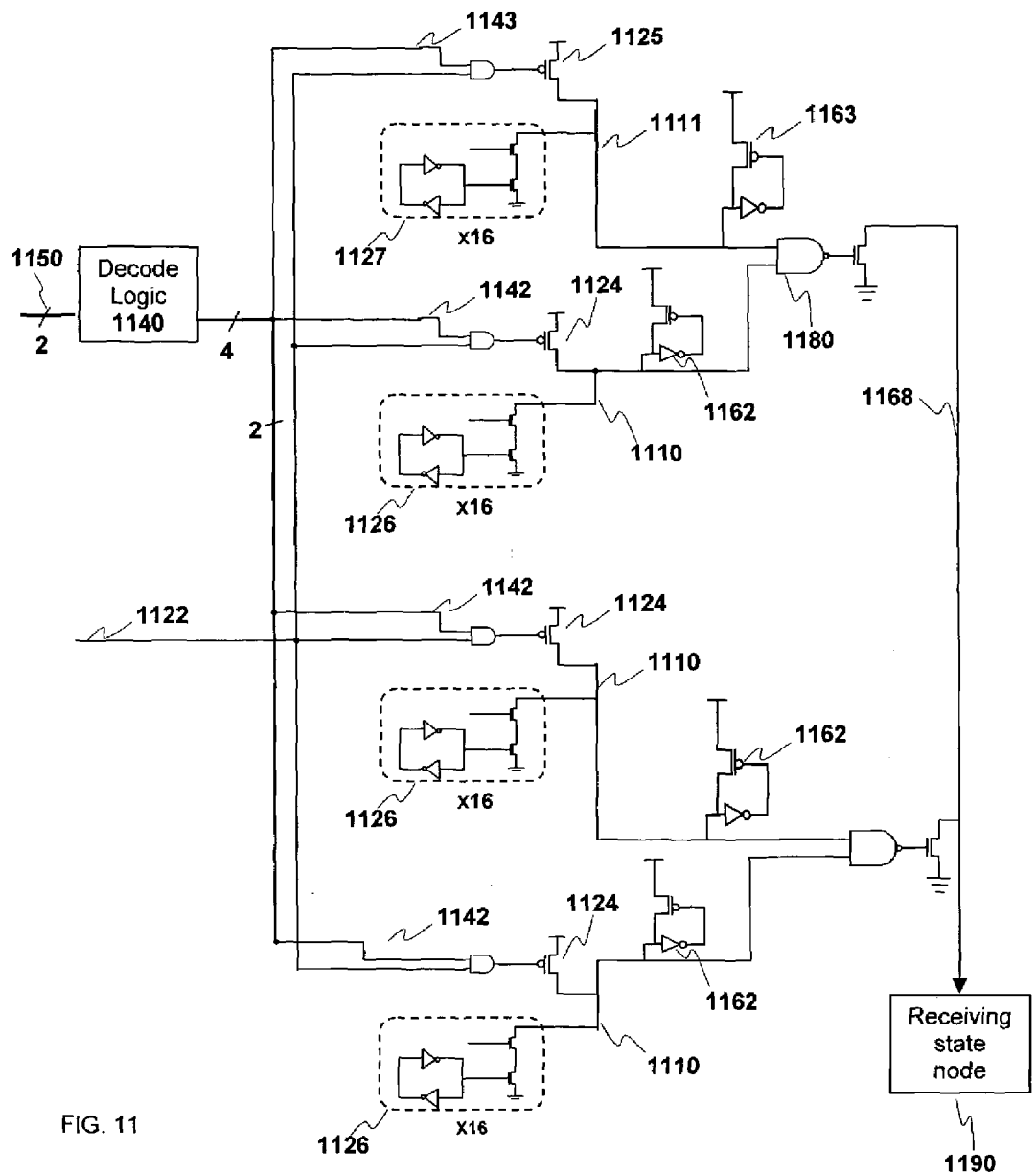
FIG. 11 illustrates a 64-bit global bit line driven by multiple 16-bit domino local bit lines, in accordance with one embodiment.

FIG. 11 illustrates a 64-bit global bit line 1168 driven by multiple 16-bit domino local bit lines 1110–1111, in accordance with one embodiment. The local bit lines 1110–1111 are each driven by a dual-purpose device 1124–1125 which performs precharge as well as conditional evaluation functions. When a clock signal 1122 is deasserted, devices 1124–1125 precharge local bit lines 1110–1111. When clock signal 1122 is asserted, decode logic signals 1142–1143 indicate whether dual-purpose devices 1124–1125 will allow the local bit lines 1110–1111 to evaluate or whether dual-purpose devices 1124–1125 will insure that precharged values on local bit lines 1110–1111 are maintained.

In the embodiment illustrated, decode logic 1140 receives the two most significant bits (MSBs) 1150 of the six address bits utilized to address a data cell from among the 64 data cells 1126–1127. The two MSBs 1150 are decoded to determine which of the segments contains the addressed data cell. By way of example, assume a first set of data cells 1127 contains a data cell to be addressed. During a precharge period of a clock 1122, dual-purpose devices 1124–1125 precharge local bit lines 1110–1111 to a high logic value. As part of an evaluation phase of the clock 1122, decode logic 1140 determines that a data cell associated with local bit line 1111 is to be read and consequently provides a corresponding decode signal 1143. Decode signal 1143 effectively "cuts off" dual-purpose device 1125, disabling the device's strong precharge hold capability for local bit line 1111. As a result, week keeper 1162 is utilized to maintain the proper logic value on local bit line 1111.

The remaining decode signals 1142 enable dual-purpose devices 1124 which drive a strong value onto local bit lines 1110 effectively insuring that the precharge values on the local bit lines 1110 are maintained during evaluation. In contrast to local bit line 1111, local bit lines 1110 do not need to rely solely on weak keepers 1162 to maintain proper voltage levels on local bit lines 1110. The addition of the conditional evaluation reduces the likelihood that leakage current through data cells 1126 will result in a voltage drop on local bit lines 1110 and consequently reduce the possibility that improper logic values on local bit lines 1110 may be propagated through merge stage 1182 to global bit line 1168.

Note that as the number of segments, and therefore the number of bit lines, increases, the probability of noise being passed to the state node decrease. For example, assume a 32 element RF that is built with two 16 bit local bit lines. If intelligent, strong holding is not performed on segments that do not contain a data cell that will drive one of the local bit lines, both local bit lines are weakly driven during evaluation. Consequently, noise from both bit lines may merge via the merge stage and then propagate down stream to a receiving state node. Such an operation may then corrupt a processor coupled to a circuit containing the receiving state node due to the processors read of incorrect values.

As described herein, for an embodiment containing two segments, one local bit line is weakly driven. However, and the other local bit line is strongly held to at its proper logic level. Thus, on this local bit line, the noise propagating downstream is only 50% in that only one of the two local bit lines may contain noise that will be propagated through merging logic. For an embodiment of a 48 element register file containing three 16 bit segments, then the noise reduction may be 66% in that two thirds of the segments will be strongly held and thus not contribute to noise that may be passed to a state node. Hence, the more segmented the register file the larger the potential benefit.

Note that the base architecture of a dynamic local bit line employing decode logic to provide assistance in maintaining proper values on a dynamic local bit line, may be a preexisting dynamic register file segmented into multiple segments of dynamic local bit lines. Note that a preexisting dynamic register file design, segmented into multiple segments of dynamic local bit lines, may be used as the base architecture of a design comprising dynamic local bit lines employing decode logic to provide assistance in maintaining proper values on a dynamic local bit line. In such a case, an existing design may be modified by adding the additional circuitry to perform the functions described above. In this manner, an existing design can be redesigned to include decode logic and the conditional evaluation device with minimal impact. This may result in the ability to achieve improved design robustness with minimal redesign effort.

Thus, a unique design of a register file for provision of high-speed access to stored data is provided. While the invention has been described in accordance with a number of embodiments, the invention should not be considered so limited. One skilled in the art will recognize that various other embodiments can be utilized to provide the advantages described herein.

What is claimed is:

1. A register file comprising:
   a dynamic local bit trace;
   a plurality of data cells coupled to the dynamic local bit trace; and
   a device coupled to the dynamic local bit trace to facilitate precharging the dynamic local bit trace to a precharge value and to intelligently hold the precharged value on the dynamic local bit trace during evaluation of the dynamic local bit trace.

2. The register file of claim 1 wherein intelligently holding the precharged value on the dynamic local bit trace comprises selectively coupling and decoupling a driving signal trace from the dynamic local bit trace.

3. The register file of claim 2 wherein selectively coupling and decoupling comprises coupling and decoupling the driving signal trace from the dynamic local bit trace based on address information associated with the plurality of data cells.

4. The register file of claim 2 wherein the driving signal trace is coupled to a power supply.

5. The register file of claim 1 wherein the device comprises a PMOS transistor.

6. The register file of claim 5 wherein a drain of the PMOS transistor is coupled to a driving signal trace and a source of the PMOS transistor is coupled to the dynamic local bit trace.

7. The register file of claim 1 wherein the device comprises an NMOS transistor.

8. The register file of claim 1 further comprising device control logic coupled to the device.

9. The register file of claim 8 further comprising:
   a clock signal trace coupled to the device control logic; and
   a select signal trace coupled to the device control logic.

10. The register file of claim 9 further comprising decode logic coupled to the select signal trace to provide an indication of an access to one of the plurality of data cells.

11. The register file of claim 10 further comprising a plurality of address signal traces coupled to the decode logic, wherein the provision of an indication of an access is based at least in part a subset of the plurality of address signal traces.

12. The register file of claim 11 wherein said subset of the plurality of address signal traces includes one or more most significant bits of the address signal traces.

13. The register file of claim 1 further comprising a domino keeper coupled to the dynamic local bit line.

14. A register file comprising:
a dynamic local bit trace;
a plurality of data cells coupled to the dynamic local bit trace; and
a device coupled to the dynamic local bit trace to facilitate precharging the dynamic local bit trace to a precharge value and to selectively couple and decouple a driving signal trace from the dynamic local bit trace to hold the precharged value on the dynamic local bit trace during evaluation of the dynamic local bit trace.

15. The register file of claim 14 wherein selectively coupling and decoupling comprises coupling and decoupling the driving signal trace from the dynamic local bit trace based on address information associated with the plurality of data cells.

16. The register file of claim 15 further comprising a domino keeper coupled to the dynamic local bit line.

17. A register file comprising:
a dynamic local bit trace;
a precharge device coupled to the dynamic local bit trace;
a plurality of data cells coupled to the dynamic local bit trace; and
a device coupled to the dynamic local bit trace to intelligently hold a precharged value on the dynamic local bit trace.

18. The register file of claim 14 further comprising decode logic coupled to the device to provide an indication to the device of an access to one of the plurality of data cells.

19. The register file of claim 18 further comprising a plurality of address signal traces coupled to the decode logic, wherein the provision of an indication is based at least in part a subset of the plurality of address signal traces.

20. A register file comprising:
a first and a second dynamic local bit trace;
a first and a second plurality of data cells correspondingly coupled to the first and the second dynamic local bit traces;
a first and a second device correspondingly coupled to the first and the second dynamic local bit traces to facilitate precharging the first and the second dynamic local bit traces to a precharge value and to intelligently hold the precharged value on the first and the second dynamic local bit traces during evaluation of the first and the second dynamic local bit traces; and
global multiplexing logic coupled to the first and the second dynamic local bit traces to facilitate provision of a data value corresponding to an accessed data cell on an output signal trace.

21. The register file of claim 20 wherein intelligently holding the precharged value on the first and the second dynamic local bit traces comprises selectively coupling and decoupling a driving signal trace from the first and the second dynamic local bit traces.

22. The register file of claim 20 further comprising a first and a second device control logic correspondingly coupled to the first and the second device.

23. The register file of claim 22 further comprising:
a first and a second clock signal trace correspondingly coupled to the first and the second device control logic; and
a first and a select signal trace correspondingly coupled to the first and the second device control logic.

24. The register file of claim 23 wherein the first and the second clock traces comprise a single clock trace.

25. The register file of claim 23 further comprising decode logic coupled to the first and the second select signal trace to provide an indication of an access to one data cell of the first and the second plurality of data cells.

26. The register file of claim 25 further comprising a plurality of address signal traces coupled to the decode logic, wherein the provision of an indication of an access is based at least in part a subset of the plurality of address signal traces.

27. The register file of claim 20 wherein at least one of the first and the second device comprises a PMOS transistor and wherein a drain of the PMOS transistor is coupled to a driving signal trace and a source of the PMOS transistor is coupled to the respective dynamic local bit trace.

28. A system comprising:
a processor including;
a register file comprising:
a first and a second dynamic local bit trace;
a first and a second plurality of data cells correspondingly coupled to the first and the second dynamic local bit traces;
a first and a second device correspondingly coupled to the first and the second dynamic local bit traces to facilitate precharging the first and the second dynamic local bit traces to a precharge value and to intelligently hold the precharged value on the first and the second dynamic local bit traces during evaluation of the first and the second dynamic local bit traces; and
global multiplexing logic coupled to the first and the second dynamic local bit traces to facilitate provision of a data value corresponding to an accessed data cell on an output signal trace;
a memory configured to store data; and
a bus coupled to the processor and memory to facilitate data exchange between the processor and memory.

29. The system of claim 28 wherein intelligently holding the precharged value on the first and the second dynamic local bit traces comprises selectively coupling and decoupling a driving signal trace from the first and the second dynamic local bit traces.

30. The system of claim 28 wherein the register file further comprises a first and a second device control logic correspondingly coupled to the first and the second device.

31. The system of claim 30 wherein the register file further comprises:
a first and a second clock signal trace correspondingly coupled to the first and the second device control logic; and
a first and a select signal trace correspondingly coupled to the first and the second device control logic.

32. The system of claim 31 wherein the first and the second clock traces comprise a single clock trace.

33. The system of claim 31 wherein the register file further comprises decode logic coupled to the first and the second select signal trace to provide an indication of an access to one data cell of the first and the second plurality of data cells.

34. The system of claim 33 wherein the register file further comprises a plurality of address signal traces coupled to the decode logic, wherein the provision of an indication of an access is based at least in part a subset of the plurality of address signal traces.

* * * * *